(12) United States Patent
Kannmacher et al.

(10) Patent No.: US 6,781,837 B2
(45) Date of Patent: Aug. 24, 2004

(54) SYSTEM AND METHOD FOR INFORMATION HANDLING SYSTEM HEAT SINK RETENTION

(75) Inventors: Tracey Kannmacher, Lago Vista, TX (US); Ralph W. Jensen, Austin, TX (US); Joshua M. Boggs, Round Rock, TX (US); Shannon Bynum, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 37 days.

(21) Appl. No.: 10/314,074

(22) Filed: Dec. 6, 2002

(65) Prior Publication Data

US 2004/0109291 A1 Jun. 10, 2004

(Under 37 CFR 1.47)

(51) Int. Cl.[7] .................................................. H05K 7/20
(52) U.S. Cl. ........................ 361/704; 361/699; 361/702; 165/80.3; 165/185; 257/707; 174/16.3
(58) Field of Search ................................ 439/485, 487; 165/80.3, 185; 257/718, 719, 722, 726, 727; 174/16.3; 29/890.03; 438/10–18, 617; 361/687, 703, 704, 705, 709–712, 717–719

(56) References Cited

U.S. PATENT DOCUMENTS

| | | | |
|---|---|---|---|
| 3,836,825 A | 9/1974 | Hall et al. ................... 317/100 |
| 4,621,304 A | 11/1986 | Oogaki et al. ............... 361/386 |
| 4,897,764 A | 1/1990 | Bruchmann et al. ........ 361/387 |
| 4,978,638 A | * 12/1990 | Buller et al. ................... 29/825 |
| 5,463,529 A | 10/1995 | Chia et al. .................... 361/704 |
| 5,738,531 A | * 4/1998 | Beaman et al. ............... 439/71 |
| 6,205,026 B1 | * 3/2001 | Wong et al. ................... 4/16.3 |
| 6,343,012 B1 | * 1/2002 | Rife ............................ 361/695 |
| 6,449,162 B1 | * 9/2002 | Corbin, Jr. et al. ......... 361/719 |

* cited by examiner

*Primary Examiner*—Michael Datskovsky
(74) *Attorney, Agent, or Firm*—Hamilton & Terrile, LLP; Robert W. Holland (57) ABSTRACT

A heat sink retention system and method secures a heat sink proximate to a packaged electronic component, such as central processing unit, by rotationally engaging the heat sink with a retaining structure secured to an information handling system planar, such as a motherboard. The retaining structure has an opening aligned with the packaged electronic component and securing lips that extend into the opening. The heat sink inserts into the opening and is rotated slightly to engage flanges extending from its base into the securing lips. The position of the securing lips relative to the planar and the thickness of the flanges results in the base of the secured heat sink having a predetermined clearance from the packaged electronic component. A locking detent biases the heat sink to contact the packaged electronic component and allows limited movement out to the predetermined clearance, thus allowing the absorption of shock without excessive heat sink movement.

19 Claims, 8 Drawing Sheets

SYSTEM AND METHOD FOR INFORMATION HANDLING SYSTEM HEAT SINK RETENTION

BACKGROUND OF THE INVENTION

1. Field of the Invention

The present invention relates in general to the field of information handling systems, and more particularly to a method and system for information handling system heat sink retention.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Over the past several years, information handling systems have grown increasingly powerful as packaged electronic components used to manufacture information handling systems are designed to include greater processing power. For instance, central processing unit ("CPU") designs operate at ever increasing speeds by reducing the size of their logical circuits to include greater numbers of transistors in a given CPU package. Information handling systems are typically built to include a number of packaged electronic components in relatively small housings, including in some instances multiple CPUs. One difficulty with the manufacture of information handling systems that include powerful packaged electronic components, such as multiple high speed CPUs, is that the heat generated by the packaged electronic components typically must be dissipated and removed from the housing to prevent the components from burning up. Generally, improved processing speeds for a packaged electronic component results in greater heat creation by that component.

In order to dissipate the increased heat generated by more powerful packaged electronic components, information handling systems have been manufactured with heat sinks having increased mass. Although, heat sinks having greater mass tend to have greater heat dissipation capabilities, more massive heat sinks take up increased space within an information handling system housing, thus making assembly of the information handling system more difficult. Further, increasing the mass of a heat sink generally increases the momentum of the heat sink during movement of the information handling system and thus makes secure attachment of the heat sink difficult under high acceleration loads. For instance, more massive heat sinks held in place by the bow spring device of U.S. Pat. No. 6,205,026 will have enough momentum under high acceleration loads to cause flexing of the bow springs that results in movement of the heat sink relative to a CPU. Since heat sinks are generally kept in contact with CPUs by heat conductive grease solutions, movement of the heat sink may result in movement of the CPU itself due to suction between the heat sink and the CPU. Under high acceleration loads with more massive heat sinks, the suction between the heat sink and the processor may actually pull the processor out of its socket, resulting in failure of the information handling system.

SUMMARY OF THE INVENTION

Therefore a need has arisen for a system and method which secures a heat sink proximate to a packaged electronic component with reduced space constraints to reduce the complexity of information handling system assembly.

A further need exists for a system and method which securely maintains a heat sink in conductive communication with a packaged electronic component to efficiently dissipate heat from the component while reducing the risk of excessive heat sink and component movement under acceleration loads.

In accordance with the present invention, a system and method are provided which substantially reduce the disadvantages and problems associated with previous systems and methods for securing a heat sink proximate to a packaged electronic component of an information handling system. A retaining structure coupled to an information handling system planar rotationally secures the heat sink over the packaged electronic component.

More specifically, the retaining structure couples to a motherboard and has an opening through which a CPU is installed in a socket of the motherboard and a heat sink is secured over the CPU. The retaining structure has securing lips that extend into the opening and the heat sink has securing flanges that extend from its base. The securing flanges insert under the securing lips by rotationally engaging the heat sink until the flange and securing lip establish a predetermined assembly clearance between the base of the heat sink and the CPU. A locking detent associated with the retaining structure provides a downward bias to provide a thermal contact force between the heat sink and the CPU. The securing lip provides a rigid surface that restricts movement of the heat sink beyond the assembly clearance. A spring associated with the detent mechanism absorbs acceleration forces applied to the heat sink. In this manner, the retaining structure separates the application of thermal contact force and the shock load retention structure of the heat sink retention system.

The present invention provides a number of important technical advantages. One example of an important technical advantage is that a heat sink is secured proximate to a packaged electronic component with a reduced space needed for assembly of an information handling system. The heat sink drops into the retainer and rotates to a locked position without manipulation of secondary devices, such as clips. Further, the heat sink is easily removed to access the underlying packaged electronic component by rotating to unlock the heat sink and lifting the heat sink out of the retainer. Thus, assembly and disassembly of a heat sink uses only the footprint of the heat sink itself over the information handling system motherboard.

Another example of an important technical advantage of the present invention is that a heat sink is securely maintained in conductive communication with a packaged electronic component to efficiently dissipate heat from the component, yet the risk of excessive heat sink and component movement under acceleration loads is reduced by allowing only limited movement of the heat sink relative to the retainer. The heat sink is pressed against the packaged electronic component with a bearing structure of coil springs that allow movement of the heat sink; however, the amount of possible movement of the heat sink is restricted by the limited room between the heat sink base and the retention structure. This limited space for possible movement of the heat sink reduces the risk of removal of the packaged electronic component from its socket due to suction between the heat sink and the component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Efficient manufacture of information handling systems that securing a heat sink to a packaged electronic component with both application of thermal contact force and shock load retention becomes more difficult as heat sink mass increases. The present invention secures a heat sink with reduced footprint and improved simplicity by rotationally engaging the heat sink with a retaining structure that is coupled to a planar of the information handling system. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
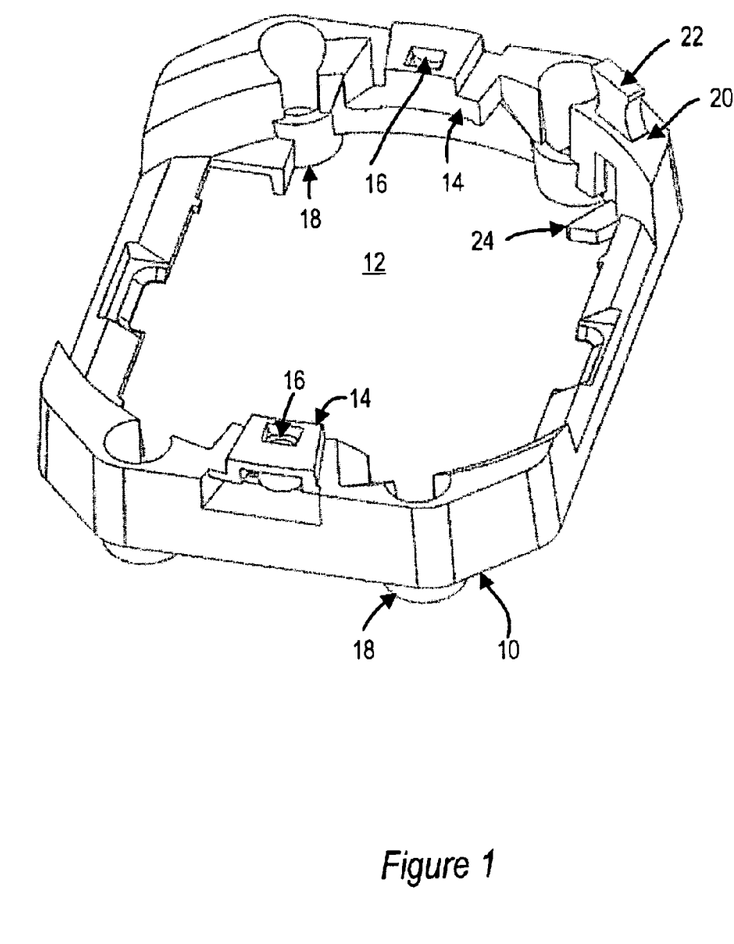
FIG. 1 depicts a top perspective view of a heat sink retaining structure.

Referring now to FIG. 1, a top perspective view of a heat sink retaining structure 10 is depicted. Retaining structure 10 defines an opening through which a CPU and heat sink are inserted. Opposing securing lips 14 extend into opening 12, each securing lip 14 including a locking detent mechanism 16. Retaining structure 10 includes securing points 18, such as screw assemblies, that secure retaining structure 10 to an information handling system planar, such as a mother or daughter board. In addition, retaining structure 10 includes a socket unlatching mechanism 20 that interacts with a planar socket to release a packaged electronic component from the socket. Socket unlatching mechanism 20 includes an actuator 22 mechanically connected with a socket release lever 24 so that lifting actuator 22 activates lever 24 to unlatch the packaged electronic component from its socket.

Figure 2:
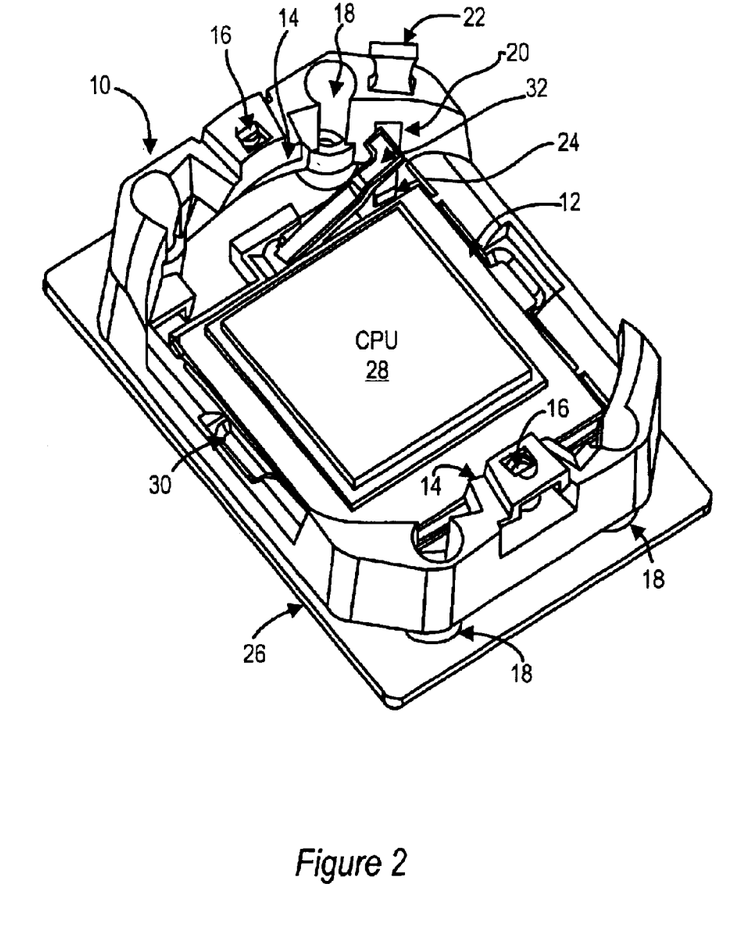
FIG. 2 depicts a top perspective view of the heat sink retaining structure coupled to a motherboard proximate a CPU.

Referring now to FIG. 2, a top perspective view depicts retaining structure 10 secured to a motherboard 26 with a CPU 28 inserted into a socket 30 that is substantially aligned with the opening 12 of retaining structure 10. Unlatching mechanism 20 is configured to unlatch a socket latch 32 with socket release lever 24 arranged beneath socket latch 32. If actuator 22 is lifted, socket release lever 24 pulls up on socket latch 32 to release CPU 28 from socket 30. Socket unlatching mechanism 20 provides a convenient device for release of CPU 28 in the restricted space available within opening 12 of retaining structure 10.

Figure 3:
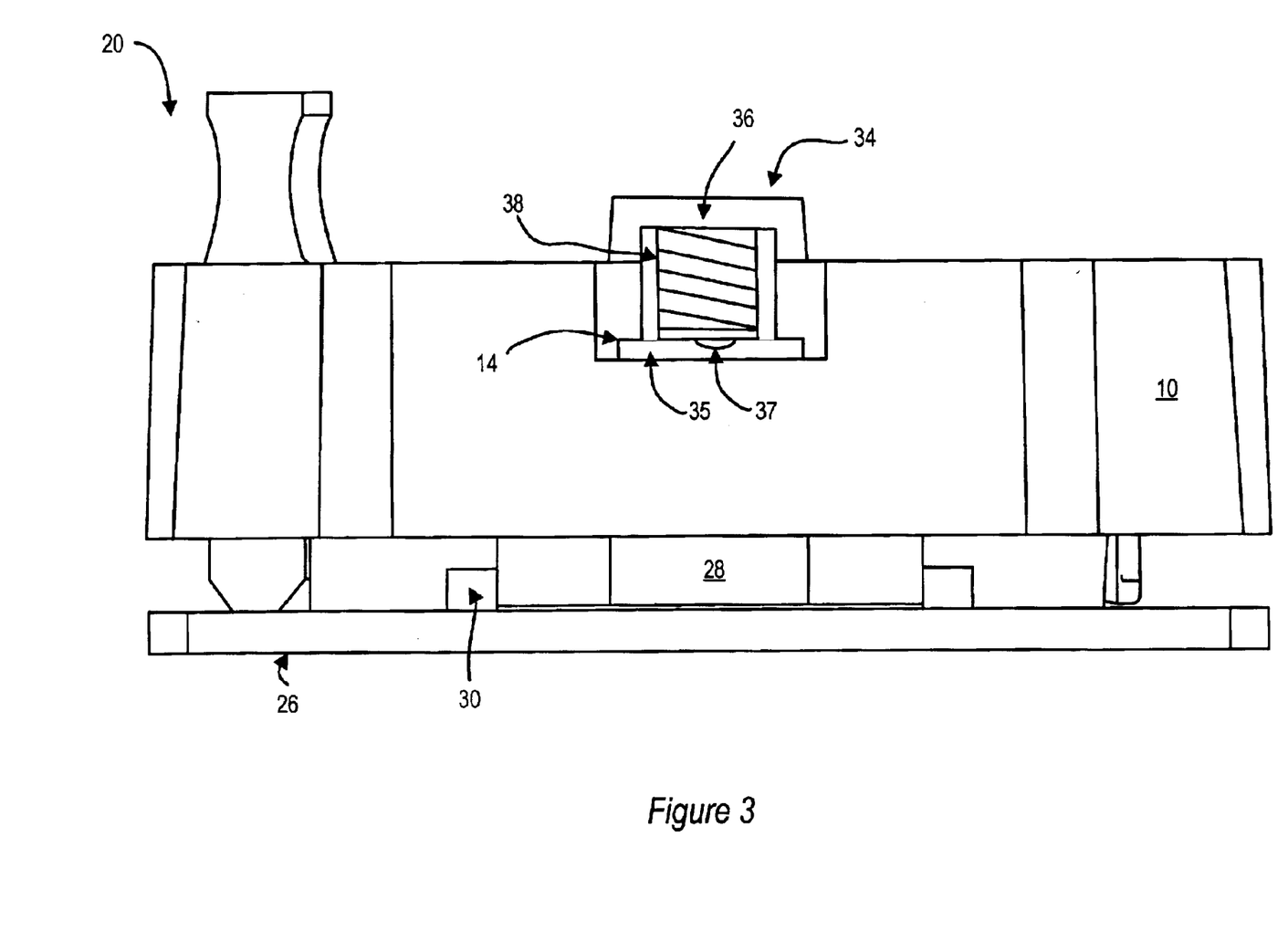
FIG. 3 depicts a side cutaway view of the heat sink retaining structure and locking detent.

Referring now to FIG. 3, a cutaway view of retaining structure 10 is depicted secured to motherboard 26 with CPU 28 disposed in the opening. A locking mechanism 34 extends from retaining structure 10 and is configured to provide a biasing force against a heat sink flange inserted into a flange opening 35 of retaining structure 10. Locking mechanism 34 includes a removably coupled plastic load bearing structure 36 that encloses a locking detent 37 and a coil spring 38. When a heat sink is rotationally engaged in retaining structure 10, the flange inserts into flange opening 35 where coil spring 38 provides a downward bias through locking detent 37 against the securing flange of the heat sink. The downward bias of coil spring 38 applies a thermal contact force through locking detent 37 against the heat sink to force the heat sink into contact with CPU 28, thus ensuring heat conduction and dissipation and providing shock load absorption for the heat sink. A securing lip 14 limits the upward movement of the heat sink under shock loads by providing a rigid structure that resists excessive movements that overpower coil spring 38's downward bias. In addition, the downward bias of coil spring 38 creates a increased friction between locking detent 37 and a detent slot of the heat sink flange to prevent inadvertent rotation and release of the heat sink.

Figure 4:
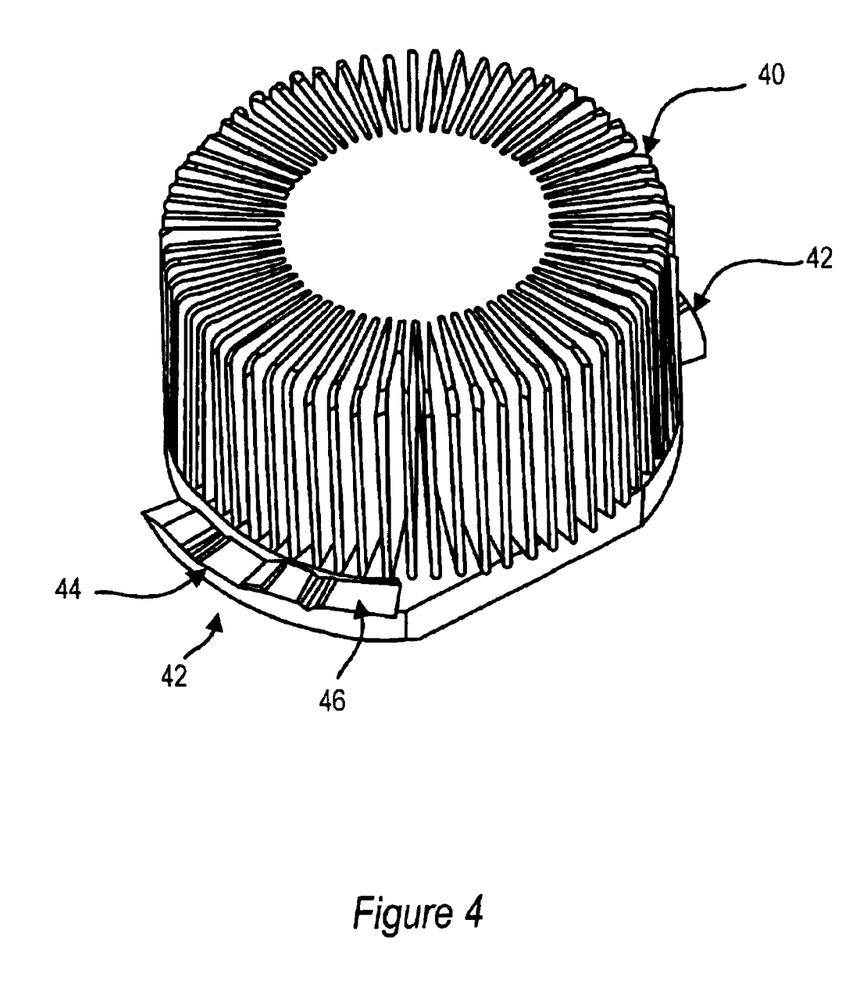
FIG. 4 depicts a side perspective view of a heat sink having flanges for rotationally engaging the heat sink retaining structure.

Referring now to FIG. 4, a side top view of a heat sink 40 is depicted. Although the depicted heat sink 40 is circular in shape to optimize dissipation of heat with a downward cooling airflow, in alternative embodiments rectangular, square or other shaped heat sinks may be used. Heat sink 40 includes securing flanges 42 extending outward from opposing sides of its base. A first flange 44 has a first height and a second flange 46 has a second height with the different heights used to adjust the spacing between the base of heat sink 40 and locking detent mechanism 34 to accommodate CPUs of different thicknesses. For instance, the first flange 44 provides a greater distance between the base of heat sink 40 and the planar when locking detent mechanism 36 presses against securing lip 14 to accommodate a thicker CPU while the second flange 46 provides less distance to accommodate a thinner CPU.

Figure 5:
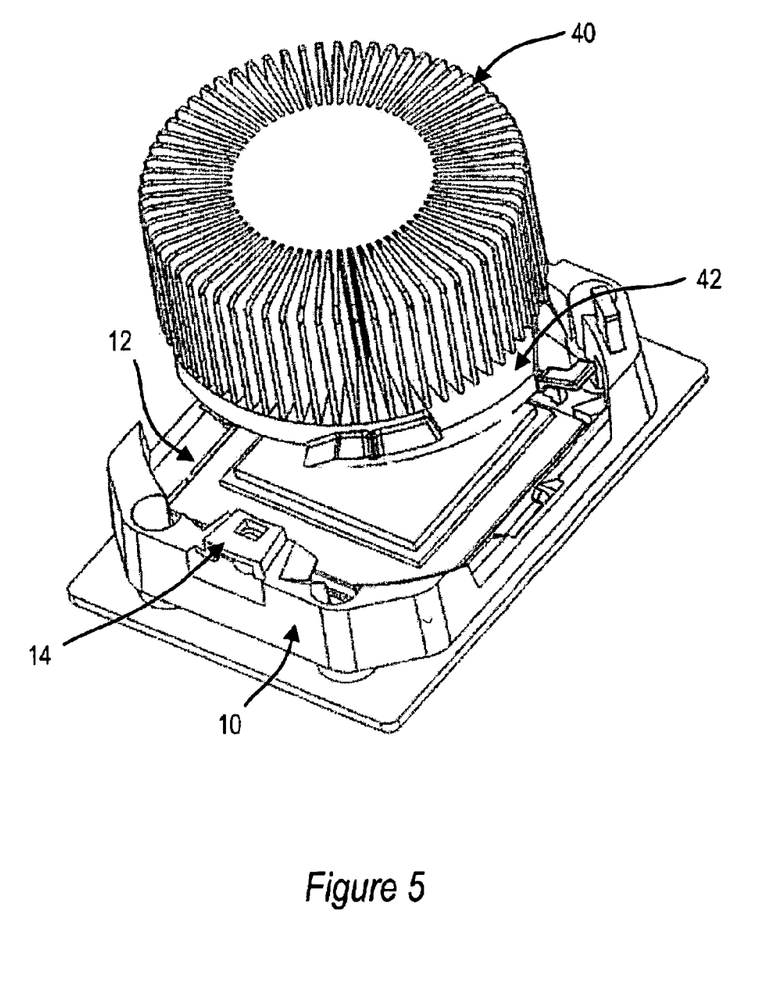
FIG. 5 depicts an exploded perspective view of a heat sink aligned for insertion in a retaining structure opening.
Figure 6:
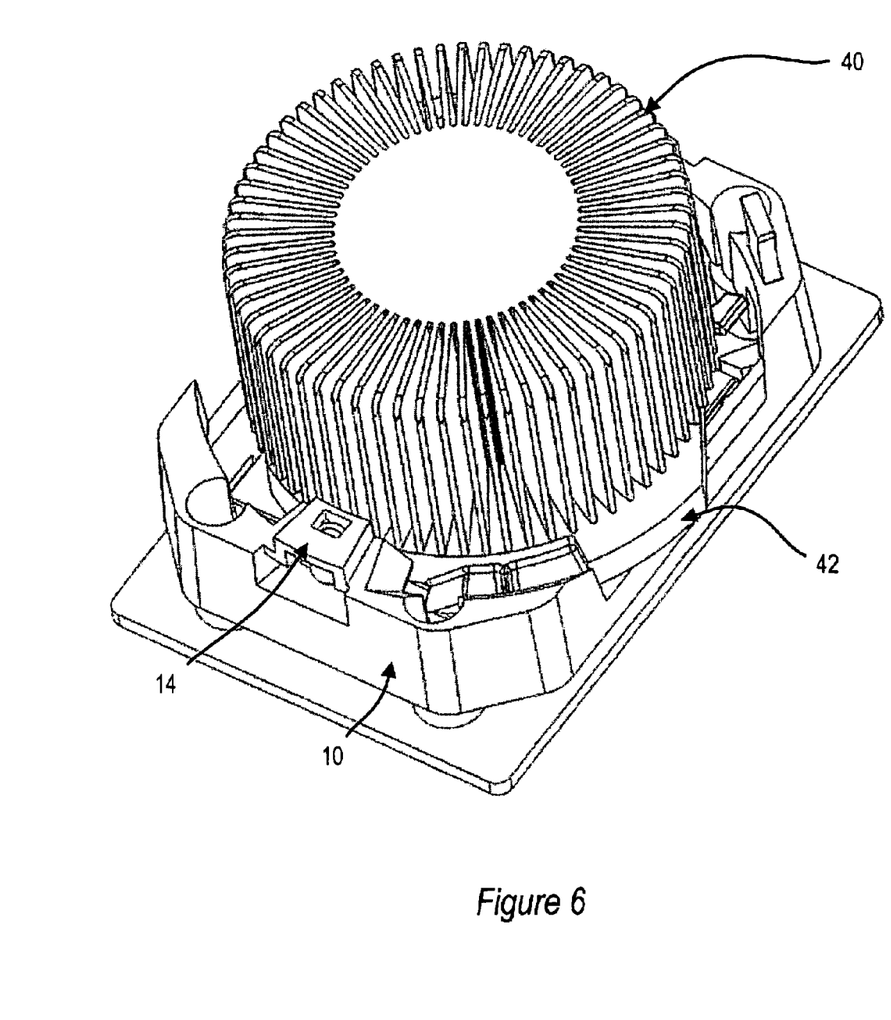
FIG. 6 depicts a top perspective view of an unsecured heat sink aligned with the retaining structure opening.
Figure 7:
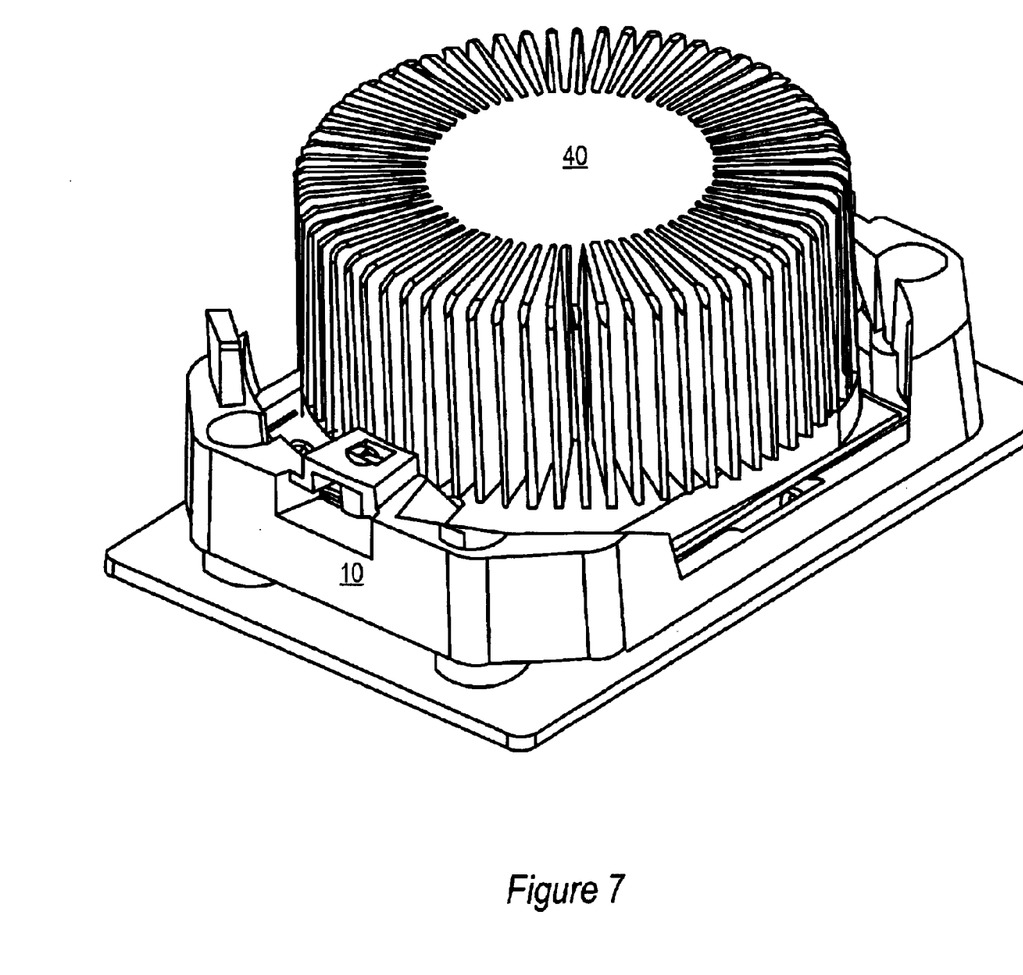
FIG. 7 depicts a side perspective view of a rotationally secured heat sink.

Referring now to FIGS. 5, 6 and 7, an exploded view, unsecured view and secured view respectively of heat sink 40 and retaining structure 10 depict the rotationally retained assembly of heat sink 40 into retaining structure 10. As depicted by FIG. 5, heat sink 40 is inserted into opening 12 of retaining structure 10 over top of CPU 28. Securing flanges 42 are aligned slightly offset from securing lips 14 to allow heat sink 40 to be fully inserted into opening 12, as depicted by FIG. 6. Heat sink 40 is then rotated so that securing flange 42 inserts beneath securing lip 14, which is designed to have a gradual sloping profile so that the upper surface of securing flange 42 engages the bottom surface of securing lip 14 as heat sink 40 is rotated. When heat sink 40 is fully engaged, as is depicted by FIG. 7, locking detent mechanism 34 clicks to indicate that the proper position has been reached. The amount of rotation is generally less than one quarter turn of heat sink 40, depending upon the thickness of CPU 28 and whether the first or second securing flange engages the securing lip.

Figure 8:
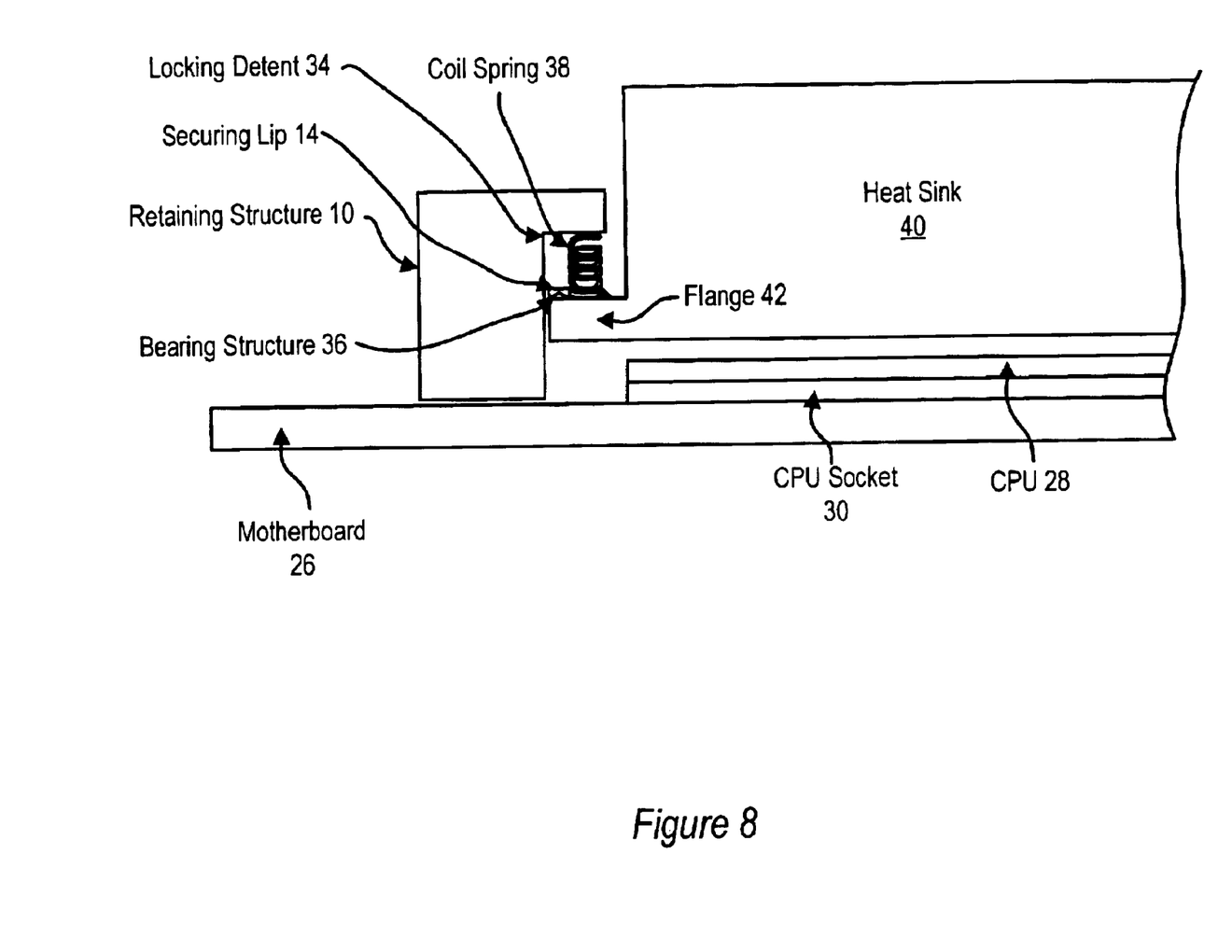
FIG. 8 depicts a cutaway view of a rotationally secured heat sink biased into contact with a CPU by a locking detent mechanism.

Referring now to FIG. 8 a side cutaway view of a fully engaged heat sink 40 depicts how the present invention separates the application of thermal contact force and the shock load retention structures. The thickness of flange 42 is set to allow a small assembly clearance between the base of heat sink 40 and CPU 28. Coil spring 38 biases heat sink 40 downwards to maintain thermal contact with CPU 28 but flexes under shock loads to allow some movement of heat sink 40. Securing lip 14 restricts heat sink 40 from making excessive movements by providing a rigid structure to prevent movement of flange 42 once coil spring 38 compresses to within securing lip 14. This allows only relatively small movements of heat sink 40, even under high acceleration forces yet offers some damping of such forces.

Although the present invention has been described in detail, it should be understood that various changes, substitutions and alterations can be made hereto without departing from the spirit and scope of the invention as defined by the appended claims.

What is claimed is:

1. An information handling system heat sink retention system, the heat sink retention system comprising:
    a retaining structure operable to couple to an information handling system planar proximate a packaged electronic component, the retaining structure having an opening substantially aligned with the packaged electronic component, the retaining structure further having opposing lips disposed in the opening; and
    a heat sink having a base operable to contact the packaged electronic component through the opening, the heat sink having flanges extending from the base, the flanges operable to slide under the lips upon rotation of the heat sink relative to the retaining structure to secure the heat sink base proximate to the packaged electronic component; and
    a socket unlatching mechanism associated with the retaining structure and operable to communicate movement to a socket latch of the information handling system, the socket latch for releasing the electronic packaged component from a socket coupled to the information handling system planar.

2. The heat sink retention system of claim 1 further comprising a locking mechanism associated with each lip, the locking mechanism biased against the flanges to force the heat sink against the packaged electronic component.

3. The heat sink retention system of claim 2 wherein the locking mechanism comprises:
    a locking detent aligned with the flange; and
    a coil spring biasing the locking detent against the flange.

4. The heat sink retention system of claim 1 wherein the information handling system planar comprises a motherboard and the packaged electronic component comprises a CPU.

5. The heat sink retention system of claim 1 wherein each retaining structure lip comprises a sloped profile operable to guide a flange to a locked position wherein the heat sink base has a predetermined clearance from the packaged electronic component.

6. The heat sink retention system of claim 5 further comprising one or more springs positioned to bias the heat sink base against the packaged electronic component.

7. The heat sink retention system of claim 1 wherein the flanges comprise multiple levels, each level associated with packaged electronic components of predetermined thickness.

8. A heat sink retention system comprising:
    retaining structure means for securing a heat sink in thermal contact with a CPU by coupling to an information handling system motherboard planar proximate the CPU; and
    heat sink means for rotationally engaging with the retaining structure means to dissipate thermal energy from the CPU; and
    locking detent means for applying thermal contact force between the heat sink means and the CPU and for absorbing shock loads with restricted movement of the heat sink means.

9. A heat sink retention system comprising:
    retaining structure means for securing a heat sink in thermal contact with a CPU be coupling to an information handling system motherboard planar proximate the CPU; and
    heat sink means for rotationally engaging with the retaining structure means to dissipate thermal energy from the CPU; and
    socket unlatching means for releasing the CPU from a socket coupled to the motherboard planar, the unlatching means incorporated with the retaining structure means.

10. A method for retaining a heat sink proximate to an information handling system CPU, the method comprising:
    coupling a retaining structure to a motherboard of the information handling system, the retaining structure having an opening aligned with the CPU;
    inserting the heat sink in the opening;
    rotating the heat sink to engage flanges of the heat sink with lips of the retaining structure until the heat sink is positioned with a predetermined clearance from the CPU; and
    biasing the heat sink against the CPU.

11. The method of claim 10 further comprising:
    selecting from plural flanges having plural thicknesses to adjust for CPU thickness.

12. The method of claim 10 further comprising:
    selecting from plural lips having plural distances from the motherboard planar to adjust for CPU thickness.

13. The method of claim 10 wherein biasing further comprises positioning a spring associated with the retaining structure to force the heat sink against the CPU.

14. The method of claim 13 further comprising locking the heat sink position relative to the retaining structure with a locking detent associated with the spring.

15. An information handling system comprising:
   a motherboard;
   a CPU coupled to the motherboard;
   a retaining structure coupled to the motherboard, the retaining structure having an open area substantially aligned with the CPU;
   securing lips extending from the retaining structure into the opening;
   a heat sink having flanges rotationally engaged with the securing lips to secure the heat sink to the retaining structure proximate the CPU; and
   a locking detent associated with each securing lip to bias the heat sink against the CPU.

16. The information handling system of claim 15 wherein the heat sink flanges restrict the heat sink from movement beyond a predetermined clearance relative to the retaining structure.

17. The information handling system of claim 16 further comprising first and second sets of flanges, each set of flanges having a thickness associated with a predetermined clearance for a CPU of a predetermined thickness.

18. An information handling system heat sink retention system, the heat sink retention system comprising:
   a retaining structure operable to couple to an information handling system planar proximate a packaged electronic component, the retaining structure having an opening substantially aligned with the packaged electronic component, the retaining structure further having opposing lips disposed in the opening;
   a heat sink having a base operable to contact the packaged electronic component through the opening, the heat sink having flanges extending from the base, the flanges operable to slide under the lips to secure the heat sink base proximate to the packaged electronic component; and
   a locking mechanism associated with each lip, the locking mechanism biased against the flanges to force the heat sink against the packaged electronic component, the locking mechanism having a locking detent aligned with the flange and a coil spring biasing the locking detent against the flange.

19. An information handling system heat sink retention system, the heat sink retention system comprising:
   a retaining structure operable to couple to an information handling system planar proximate a packaged electronic component, the retaining structure having an opening substantially aligned with the packaged electronic component, the retaining structure further having opposing lips disposed in the opening, each retaining structure lip having a sloped profile operable to guide a flange to a locked position;
   a heat sink having a base operable to contact the packaged electronic component through the opening, the heat sink having flanges extending from the base, the flanges operable to slide under the lips to secure the heat sink base proximate to the packaged electronic component; and
   one or more springs positioned to bias the heat sink base against the packaged electronic component.

* * * * *